US012793803B2

(12) United States Patent
Majumdar et al.

(10) Patent No.: US 12,793,803 B2
(45) Date of Patent: Nov. 10, 2026

(54) DETERMINISTIC BUILT-IN SELF-TEST

(71) Applicant: XILINX, INC., San Jose, CA (US)

(72) Inventors: Amitava Majumdar, San Jose, CA (US); Albert Shih-Huai Lin, Mountain View, CA (US); Partho Tapan Chaudhuri, Hyderabad (IN); Pramod Bhardwaj, San Jose, CA (US); Sarosh I. Azad, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 18/608,175

(22) Filed: Mar. 18, 2024

(65) Prior Publication Data

US 2025/0292853 A1 Sep. 18, 2025

(51) Int. Cl.
*G11C 29/12* (2006.01)

(52) U.S. Cl.
CPC ................................ *G11C 29/1201* (2013.01)

(58) Field of Classification Search
None
See application file for complete search history.

(56) References Cited

U.S. PATENT DOCUMENTS 8,583,973 B1 * 11/2013 Chakravarty .... G01R 31/31703 714/733
2003/0120974 A1 * 6/2003 Adams .................... G11C 8/16 714/E11.176
2003/0131327 A1 * 7/2003 Dervisoglu .... G01R 31/318586 714/727
2008/0034192 A1 * 2/2008 Lin .................... G06F 9/30141 712/228
2020/0309851 A1 * 10/2020 Narayanan ..... G01R 31/318555
2022/0120811 A1 * 4/2022 Sinha ............. G01R 31/318555
2024/0003973 A1 * 1/2024 Thekke Veetil .... G06F 11/3089

OTHER PUBLICATIONS

Hussain Al-Asaad and Mayank Shringi, On-Line Built-in Self-Test for Operational Faults, IEEE (Year: 2000).*

* cited by examiner

*Primary Examiner* — Guerrier Merant
(74) *Attorney, Agent, or Firm* — Patterson + Sheridan, LLP

(57) ABSTRACT

Embodiments herein describe a computer architecture including a device having a test vector memory (TVM) space configured to store test patterns and a deterministic built-in self-test (DBIST) direct memory access (DMA) controller configured to receive the test patterns directly from the TVM space and apply the test patterns to at least one hardware block under test. The DBIST DMA controller sends a scan bus signal and a scan clock signal to the at least one hardware block under test, the scan bus signal providing the test patterns to the at least one hardware block under test. The test patterns are generated by a manufacturer of the at least one hardware block under test.

20 Claims, 11 Drawing Sheets

Lockout Entry

Lockout Exit

DETERMINISTIC BUILT-IN SELF-TEST

TECHNICAL FIELD

Examples of the present disclosure generally relate to a deterministic built-in self-test.

BACKGROUND

Deterministic Built-In Self-Test (DBIST) is a technique employed in the field of digital circuit testing to ensure the reliable functionality of integrated circuits (ICs) and electronic systems. The primary goal of DBIST is to detect faults or defects in the circuitry through a set of predefined deterministic test patterns. Unlike traditional random testing approaches, which may not guarantee full fault coverage, DBIST offers a more systematic and deterministic method for detecting faults. DBIST thus provides a comprehensive and deterministic testing methodology to detect faults in digital circuits. DBIST utilizes predetermined test patterns designed to thoroughly evaluate the various components of the digital circuit. These test patterns are carefully designed to target specific faults, ensuring that the testing process covers a wide range of potential defects.

SUMMARY

One embodiment described herein is a computer architecture including a device having a test vector memory (TVM) space configured to store test patterns and a deterministic built-in self-test (DBIST) direct memory access (DMA) controller configured to receive the test patterns directly from the TVM space and apply the test patterns to at least one hardware block under test.

One embodiment described herein is a method for using a device to store test patterns in a test vector memory (TVM) space and allow a deterministic built-in self-test (DBIST) direct memory access (DMA) controller to receive the test patterns directly from the TVM space and apply the test patterns to at least one hardware block under test.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
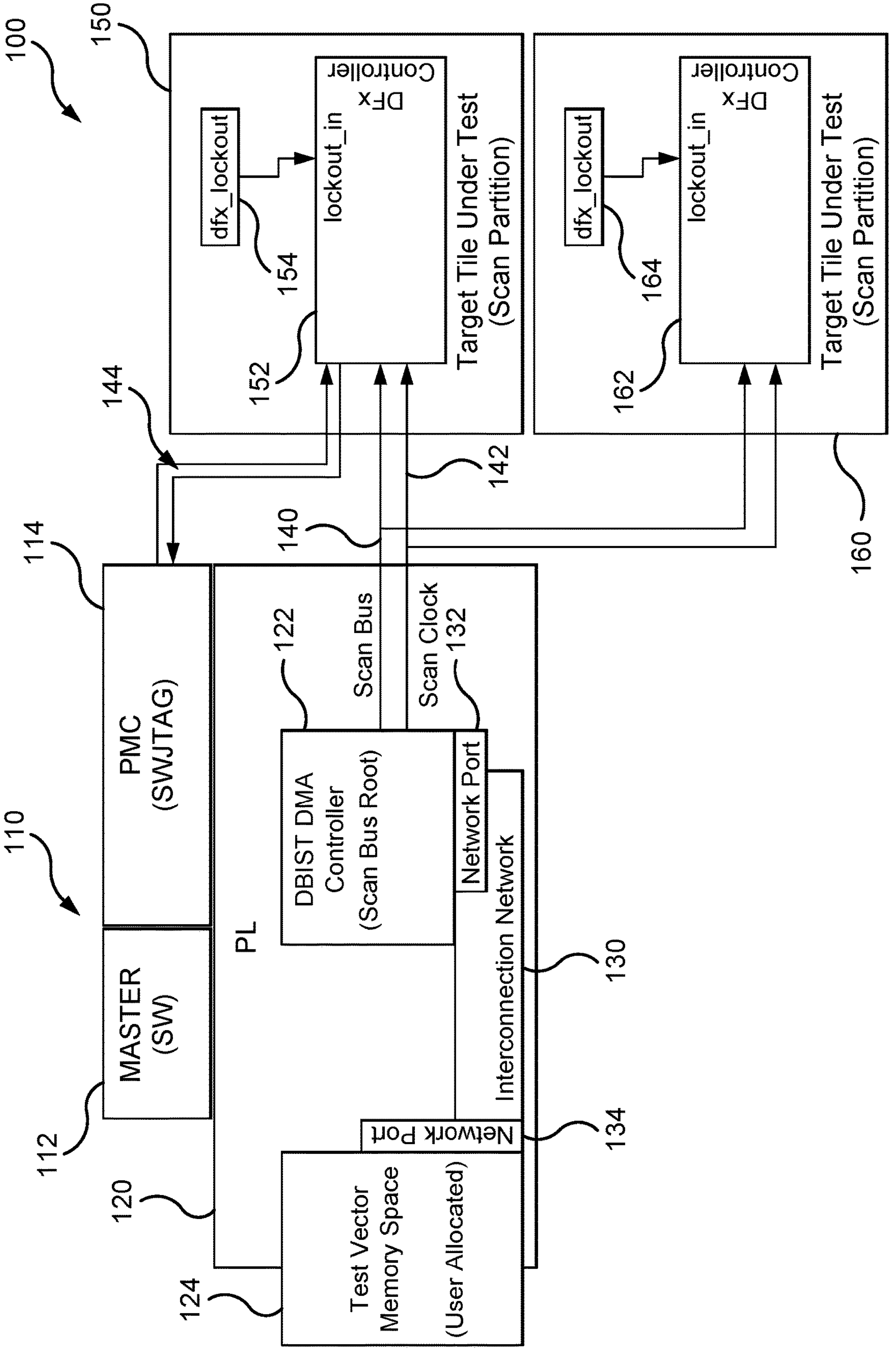
FIG. 1 illustrates a Deterministic Built-In Self-Test (DBIST) architecture, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the embodiments herein or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

The chip manufacturing process is complex and prone to flaws, which are referred to as faults. A fault is testable if a well-defined mechanism exists to disclose it in the silicon. Designers need to incorporate more logic to make the task of detecting as many defects as possible in a design practicable. Design for testability (DFT) refers to design principles that make testing possible. One such methodology is Automatic Test Pattern Generation (ATPG). ATPG tools use deterministic test pattern generation when a test pattern is created that is intended to detect a given fault. The ATPG tools are a complete suite of software tools used to produce test patterns and gather diagnostic data for electronic assemblies.

ATPG is an electronic design automation (EDA) method/technology used to find an input or test sequence. When applied to a digital circuit, ATPG enables automatic test equipment to distinguish between the correct circuit behavior and the faulty circuit behavior caused by defects. The generated patterns are used to test semiconductor devices after manufacture, or to assist with determining the cause of failure. The effectiveness of ATPG is measured by the number of modeled defects, or fault models, detectable by the number of generated patterns. These metrics generally indicate test quality (higher with more fault detections) and test application time (higher with more patterns). These test patterns help detect and diagnose any faults that may arise during the operation of the circuit. The faults can occur due to defects in the manufacturing process, aging effects, or other environmental factors.

ATPG efficiency is another important consideration that is influenced by the fault model under consideration, the type of circuit under test (full scan, synchronous sequential, or asynchronous sequential), the level of abstraction used to represent the circuit under test (gate, register-transfer, switch), and the required test quality. The advantages of ATPG relate to at least test coverage, cost-effectiveness, time-saving, and easy implantation. ATPG algorithms allow for generating test patterns for defect coverage. That means they can generate an effective set of test patterns needed for detecting all possible faults. ATPG reduces the cost of testing as it automates the process, eliminating the need for manually generating test patterns. Manual generation of test patterns for high coverage of defects is intractable, time-consuming and expensive. ATPG can generate test patterns quickly, saving time during the design and testing phase. ATPG can be easily implemented in the design and testing phase of a circuit.

JTAG has become a standard in embedded systems, and it is available in nearly every microcontroller and field-programmable gate array (FPGA) on the market. It's named for the group which developed it, that is, the Joint Test Action Group. The standard itself provides the implementation of boundary scan, that is, each input/output (IO) pin on a device is provided with a small logic cell between the internal logic and the physical pin, and all of these logic cells are connected so that they can shift data in one direction around the chip. Pin values can be read or written to test functionality.

In addition, JTAG specifies a test access port (TAP) which is a logic block responsible for executing tests and managing data flow along the boundary cells. The TAP, which is essentially a state machine and several shift registers, can be made to execute commands, such as data load and data read. However, the framework is general enough that manufacturers have freedom to add commands and logic blocks, which provide things like programming and debugging access.

IJTAG, or the "Internal Joint Test Action Group," is a standard for embedded instruments and testing within ICs and systems. The IJTAG standard is defined by the IEEE 1687 working group and is formally known as IEEE Std 1687-2014. The IJTAG standard provides a standardized approach to accessing and controlling embedded instruments, such as test and measurement resources, within semiconductor devices.

IJTAG provides a standardized interface for accessing and controlling embedded instruments. This standardization simplifies the integration of testing and debugging capabilities into the design and manufacturing process. By providing a standardized and flexible interface for accessing embedded instruments, IJTAG enhances the testability of ICs. IJTAG allows for more efficient testing and diagnosis of faults, contributing to improved yield and reliability. IJTAG enables enhanced debugging capabilities by providing a standardized way to access on-chip instruments for debugging purposes. This is particularly important in the development and validation phases of IC design. IJTAG serves as a standard test interface, helping to overcome the challenges associated with the increasing complexity of ICs. IJTAG allows for a more systematic and standardized approach to testing in the presence of multiple embedded instruments.

Overall, IJTAG is a standard that contributes to the efficient testing and debugging of complex ICs by providing a standardized approach to accessing and controlling embedded instruments within the devices. IJTAG helps improve the testability, reliability, and overall quality of ICs in various applications.

DFx, which stands for Design for excellence, is a collective term used in the field of electronics and semiconductor design to represent various engineering practices aimed at optimizing different aspects of the design process and the resulting product. The "X" in DFx can be replaced with different attributes, depending on the specific focus. For example, DFT involves designing electronic systems in a way that facilitates the testing and debugging processes. This includes incorporating features such as scan chains, test points, and Built-In Self-Test (BIST) capabilities to improve the ease and efficiency of testing during production and throughout the product's life cycle.

Therefore, taking ATPG, JTAG, IJTAG, and DFx collectively into account, an automated process of generating test patterns is used to detect faults or defects within an IC or a digital system to ensure that all potential faults in the design are covered by the test patterns. Currently, the test patterns are generated randomly by a random number generator in the field. Test patterns generated at the manufacturing facility or location are not provided with the device when the device is shipped to the field. The exemplary embodiments provide for a mechanism to generate test patterns at the manufacturing facility and send such generated test patterns with the device to the field. Thus, the test patterns generated at the manufacturing facility can be applied in the field. As such, the user has more control of the test patterns, as they are not randomly generated, and a deterministic test coverage can be achieved to have the device tested more exhaustively in the field. Therefore, one advantage of the present invention is enabling a more exhaustive testing of the device in the field by potentially applying hundreds of test patterns generated by the manufacturer of the device where the test patterns are known to be highly efficient in getting high fault coverage while minimizing test time.

FIG. 1 illustrates a Deterministic Built-In Self-Test (DBIST) architecture, according to an example.

The DBIST architecture 100 includes a DBIST component 110 for testing hardware blocks 150, 160. The hardware blocks 150, 160 can also be referred to as tiles or target tiles or target tiles under test. The hardware blocks 150, 160 were designed and created by the manufacturer.

In one example, the DBIST component 110 may include programmable logic (PL) 120 communicating with the master software (SW) 112 and the platform management controller (PMC) 114 having SW JTAG. In other examples, the DBIST component 110 may be hardened into a hardware (HW) block or can be run as software (SW). The PMC 114 has its own functions but also supports other features. For example, the PMC 114 can exercise the JTAG interface for the hardware blocks 150, 160 under test using the SW JTAG interface. As such, the PMC 114 enables the test functions of the hardware blocks 150, 160 and the software that is listed will be part of the form used to trigger the PMC 114 to access the hardware blocks 150, 160 through the SW JTAG interface and be used in the built-in test mode.

The PL 120 includes a DBIST direct memory access (DMA) controller 122 and a test vector memory space 124. In one example, the PL 120 can be part of, e.g., a field programmable gate array (FPGA). However, in other examples, the DBIST DMA controller 122 may be hardened or run fully in SW. The DBIST DMA controller 122 has a network port 132 and the test vector memory space 124 has a network port 134. An interconnection network 130 provides communication between the network port 132 of the DBIST DMA controller 122 and the network port 134 of the test vector memory space 124.

The DBIST DMA controller 122 generates at least two pieces of information, that is, the scan data conducted over scan bus 140 and the scan clock 142. The scan bus 140 provides data to the DFx controller 152 of hardware block 150 and to the DFx controller 162 of the hardware block 160. The data provided to the DFx controller 152 and the DFx controller 162 are test patterns. The DBIST DMA controller 122 can include a plurality of test patterns. In one example, the test patterns can be in the hundreds of test patterns. The test patterns are selected by the manufacturer of the hardware blocks 150, 160 in such a way as to target specific faults and to maximize fault coverage for each of the hardware blocks 150, 160 coupled to the DBIST component 110.

In one example, hardware block 150 and hardware block 160 can both be exposed to the same test patterns. In another example, hardware block 150 and hardware block 160 can be exposed to different test patterns. In yet another example, test patterns can be applied that test the interface between the hardware block 150 and the hardware block 160. Testing interfaces between hardware blocks can be referred to as X tests or EXTEST, which stands for external test or test of external interface. The DBIST architecture 100 has the capability to perform all types of tests, including applying test patterns to specific hardware blocks and applying test patterns to interfaces between the hardware blocks.

The test vector memory space 124 can be any type of memory. In one example, the test vector memory space 124 can be random access memory (RAM), dynamic RAM (DRAM) or synchronous dynamic RAM (SDRAM). In another example, the test vector memory space 124 can be double data rate (DDR) memory. DDR, also known as DDR SDRAM (Synchronous Dynamic Random Access Memory), stands for Synchronous Dynamic Random Access Memory, which means that the memory is synchronized with the system clock and can access any memory location in a random order. DDR transfers data on the rising and falling edges of the clock signal, allowing for faster data transfer rates. In another example, the test vector memory space 124 can be, e.g., memory on the Internet. Thus, the main criterion of the test vector memory space 124 is that it can be accessible through the interconnection network 130.

The interconnection network 130 allows connectivity within and across various systems. The hardware block 150 may include the DFx controller 152 and optionally a dfx_lockout 154. The hardware block 150 is a target tile under test. Similarly, the hardware block 160 may include the DFx controller 162 and optionally a dfx_lockout 164. The hardware block 160 is also a target tile under test. The hardware block 150 and the hardware block 160 are hardened. The hardware block 150 and the hardware block 160 are hardened and shipped to an end user to perform one or more desired functions. The dfx_lockout 154 and the dfx_lockout 164 are security features. DBIST may be implemented with or without the lockout features. The dfx_lockout 154 and the dfx_lockout 164 prevent unauthorized users from accessing the hardware block 150 and the hardware block 160, when the hardware block 150 and the hardware block 160 couple to the DBIST component 110.

A side channel 144 using IJTAG can also be used to program the PMC 114.

Additionally, firmware (FW) can be used to configure, control, and administer scan tests. The FW can configure the soft IP into the fabric or PL 120, which can then be used to apply the test patterns. The FW can use control and status features (e.g., IEEE 1687 or processor network-on-chip (NoC) programming interface) to control and obtain a status of the test. IEEE 1687 is an active IEEE standard that defines a way to access monitoring data inside an IC using the IEEE 1149.1 test access port (TAP) or other additional means. IEEE 1687 is also known as internal JTAG or IJTAG, and provides a set of control capabilities for setting up and managing the tests of various internal blocks. The FW can also use a DFx bus with control and data pipelined together for enabling a quicker test that is standardized across all intellectual property (IP) cores. The FW can also aid in accessing a status of a test through the IJTAG network and determine a pass/fail for each test pattern applied to each hardware block.

The DBIST architecture 100 further allows hardware blocks to be tested while other hardware blocks whose inputs may be driven by the hardware blocks under test, and whose functionality may depend on such hardware blocks under test, to remain functional. For example, a plurality of hardware blocks (not shown) may be coupled to the hardware block 150. The hardware block 150 may be under test. In other words, a plurality of test patterns are applied to the hardware block 150. The inputs of the plurality of hardware blocks may be driven by the hardware block 150 under test. However, even though the hardware block 150 is under test, the functionality of the plurality of hardware blocks remains intact. The operation or functionality of the plurality of hardware blocks coupled to the hardware block 150 is not affected by the testing of the hardware block 150.

There are at least three ways to accomplish this.

In one instance, the plurality of hardware blocks coupled to the hardware block 150 are informed that the hardware block 150 is under test and such plurality of hardware blocks may themselves determine not to access certain, e.g., critical signals that can throw off interrupts. This can be accomplished by employing firmware (FW) that allows the plurality of hardware blocks to remain functional by ignoring inputs from the plurality of hardware blocks that may affect the DBIST mode.

In another instance, the hardware block 150 itself that is under test may have safe logic with safe values that prevent the hardware block 150 from causing any unwanted scenarios for the plurality of hardware blocks coupled thereto. The safe logic of the hardware block 150 may be clamping output logic that allows the plurality of hardware blocks, whose inputs are driven by the hardware block 150, to remain in functional mode for the duration of the DBIST test of block 150. The output clamping logic allows, e.g., a clocking signal to remain as a free running clock so that the plurality of hardware blocks coupled to the hardware block 150 are not impacted by, e.g., a glitch on the clock signal or any incorrect clocks coming out of the clocking signal. In one example, glitch-free multiplexers may be added to make certain that the hardware block 150 remains in a state where the clocking signal is not being disturbed.

In yet another example, clocking methodologies can be used to allow the plurality of hardware blocks, whose inputs are driven by the hardware block 150, to remain in functional mode for the duration of the DBIST test. The clocking methodologies may involve receiving normal input clocks from the plurality of hardware blocks under DBIST, through the duration of the DBIST.

The hardware block 150 (or the hardware block 160) can be referred to as a artificial intelligence engine (AIE) tile or a PSXC tile, where PSXC is a processing subsystem.

Figure 2:
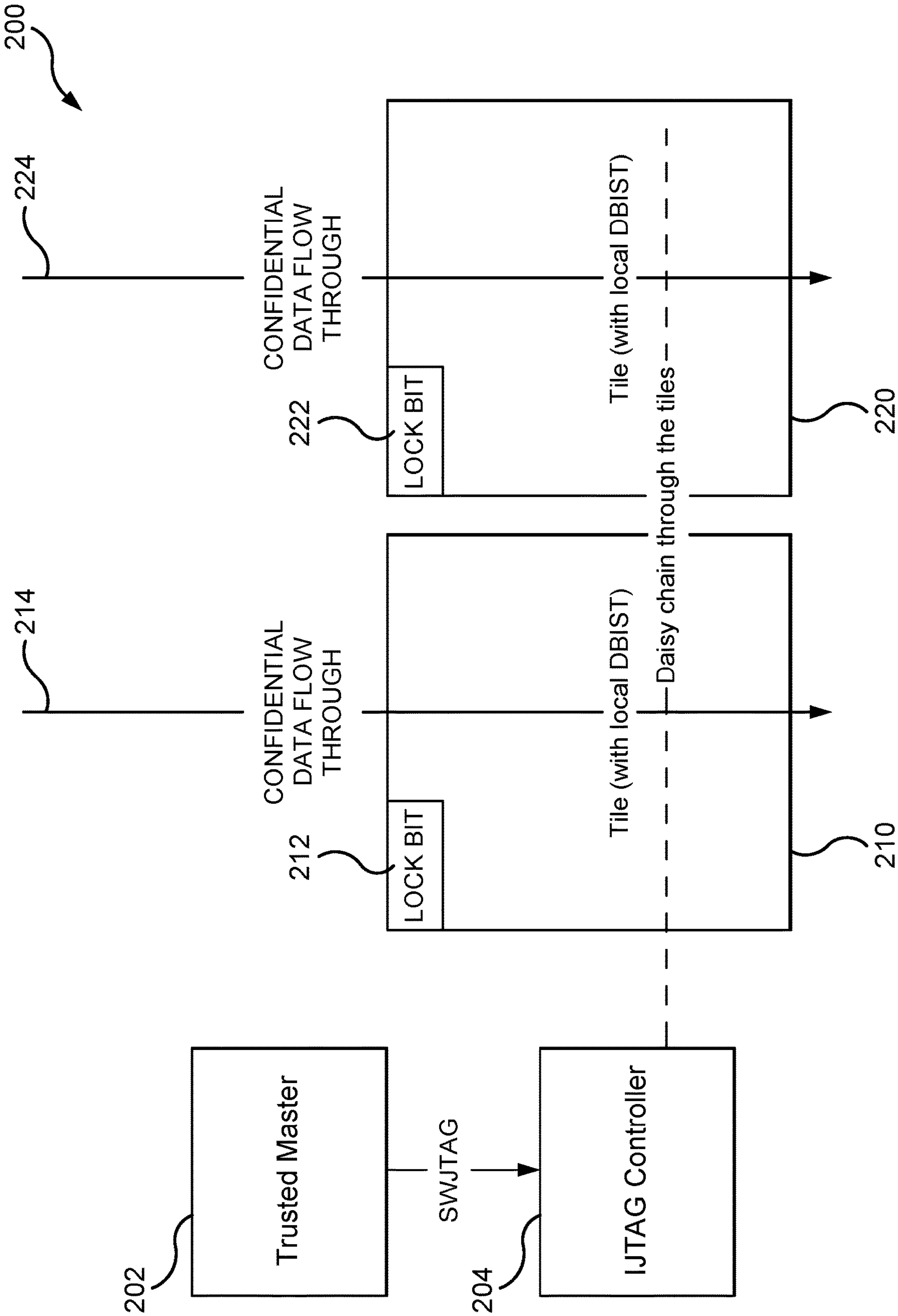
FIG. 2 illustrates a Design for excellence (DFx) lockout register requirement, according to an example.

FIG. 2 illustrates a Design for excellence (DFx) lockout register requirement, according to an example.

The DFx lockout register requirement 200 depicts a trusted master 202 and an IJTAG controller 204. The trusted master 202 provides software JTAG (SWJTAG) to the IJTAG controller 204. The IJTAG controller 204 controls the lock bit 212 and the lock bit 222. The lock bit 212 may be incorporated into the tile 210 and the lock bit 222 may be incorporated into the tile 220. In one example, the tile 210 can be the hardware block 150 and the tile 220 can be the hardware block 160. Data 214 can flow through the tile 210 and data 224 can flow through the tile 220. The lock bit 212 and the lock bit 222 are lock bit mechanisms configured to disable bits or circuit segments within the respective tiles 210, 220. The lock bit 212 and the lock bit 222 provide a security feature for the customer that owns and/or operates the tiles 210, 220. The owner and/or operator of the tiles 210, 220 can thus designate certain blocks that are not accessible by the DBIST component 110 for DBIST testing. In certain instances, a notification may be sent back to the DBIST component 110 informing the DBIST component 110 of certain blocks with their locked bits set by SW that are inaccessible to the DBIST component 110. In certain instances, a notification may be sent back to the DBIST component 110 informing the DBIST component 110 of successful attempts to access certain data and apply test patterns to such data.

FIG. 2 thus provides methods to allow applications to disable the DBIST mode in the tiles 210, 220. This may be implemented by allowing the FW to program a test-disable flag, that is, the dfx_lockout 154 and the dfx_lockout 164 in each intellectual property (IP) core, which, in turn, disables the IP's internal control status feature. The IP core is a block of logic or data used in the creation of the chip. In one example, the control status feature can be the IEEE 1687 standard. The dfx_lockout 154 and the dfx_lockout 164 may disable all the test modes of the hardware blocks 150, 160.

Figure 3:
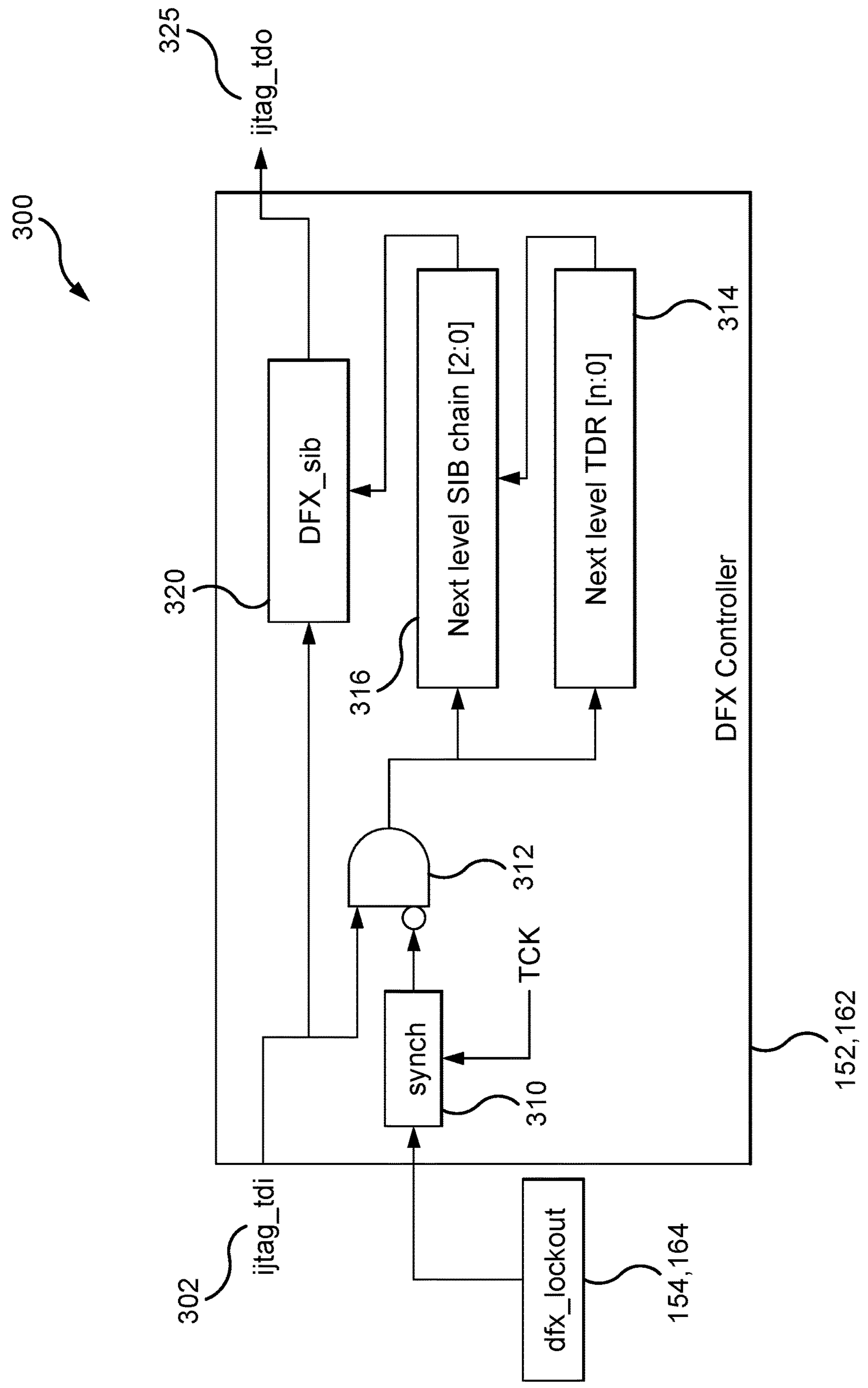
FIG. 3 illustrates a DFx lockout implementation, according to an example.

FIG. 3 illustrates a DFx lockout implementation or block 300, according to an example.

The DFx controller 152, 154 communicates with the dfx_lockout 154 and the dfx_lockout 164, which are security features and provide lockout bits, as well as clock signals from the synchronization clock 310. The dfx_lockout 154 and the dfx_lockout 164 assert a lockout state. The programmable components of the DFx controller 152, 154 include the blocks 314, 316, 320.

A signal 302, e.g., ijtag_tdi is provided to the DFx_sib 320, as well as to the logic 312. The DFx_sib 320 is a test or debug for a segment insertion bit (SIB). The SIB behaves as a gateway with respect to the segment it controls. The SIB either bypasses the segment or includes the segment into the active path. The SIB can segment the scan path according to a user requirement. The SIB acts as a door or a switch. When the switch (SIB bit) is open, it allows adding the scan path to the IJTAG network. When the switch (SIB bit) is closed, it excludes the particular scan path from the IJTAG network. When the SIB is set to logic 0, it acts like a bypass register that bypasses the instrument. When the SIB is set to logic 1, it includes the instrument on the active scan path.

When the SIB is set to logic 0, a signal 325, e.g., ijtag_tdo is output, and blocks 314, 316 are disabled. As such, it acts like a bypass register or bypass path. When the SIB is set to logic 1, blocks 314, 316 are activated. The dfx_lockout 154 and the dfx_lockout 164 provide lockout bits, as well as clock signals from the synchronization clock 310 and the logic 312 so that the next level test data register (TDR) (block 314) and next level SIB chain (block 316) cannot be controlled through IJTAG for any DFx functions. Setting the lockout bit effectively locks out the block 300 from DBIST or any kind of test access ensuring that block 300 can be in functional (or mission) mode without any disruption. However, even if the lockout bit is set, the DFx_sib 320 remains accessible through IJTAG.IJTAG. This ensures upstream and downstream hardware blocks undergoing DBIST from seeing a disruption in their communication with the Master running in PMC 114.

Figure 4:
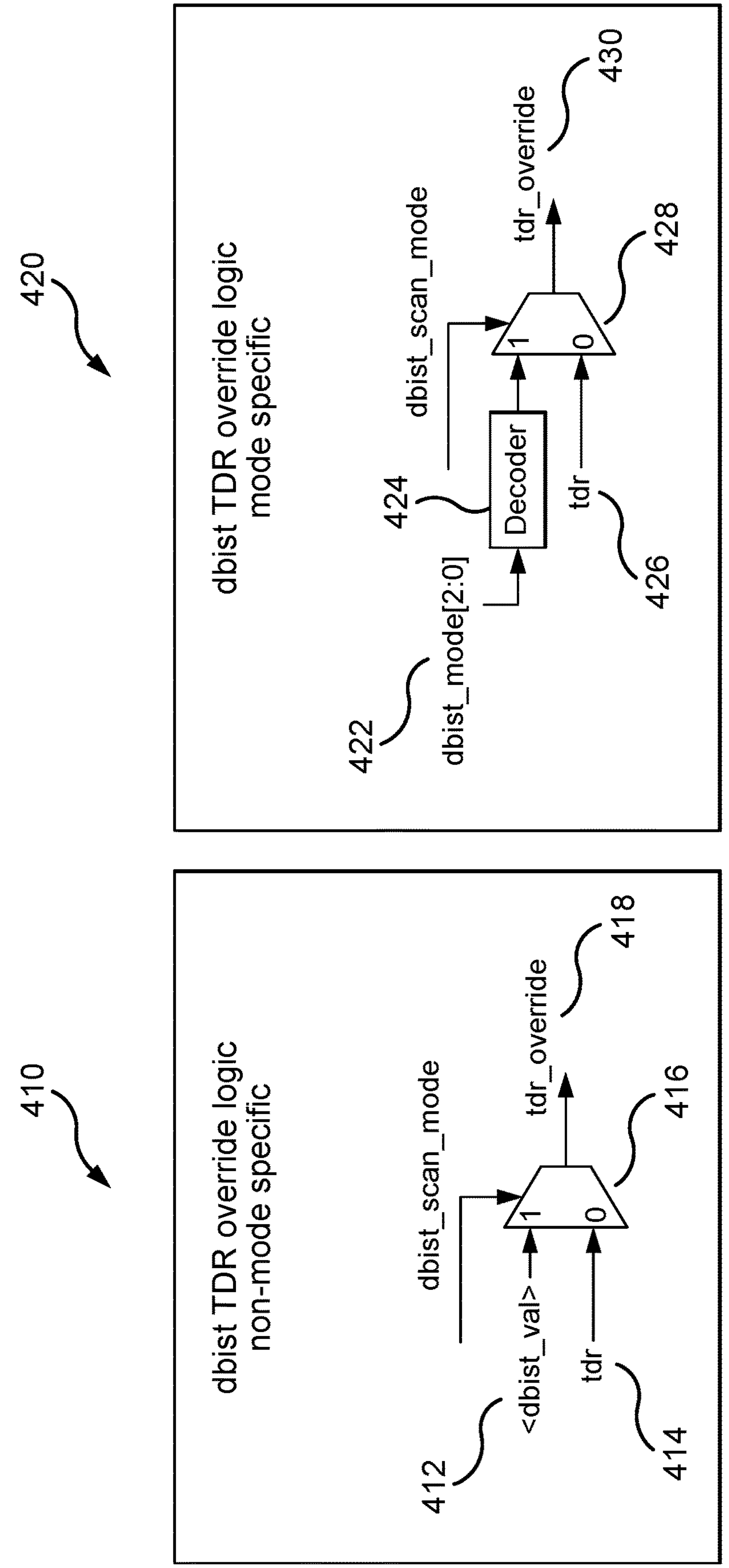
FIG. 4 illustrates DBIST Internal Joint Test Action Group (IJTAG) overrides, according to an example.

FIG. 4 illustrates DBIST Internal Joint Test Action Group (IJTAG) overrides, according to an example.

The override logic for the non-mode specific implementation is designated as 410 and the override logic for the mode specific implementation is designated as 420. The override logic 410 and the override logic 420 are used to programs the test data registers (TDRs).

The override logic 410 allows entering the DBIST mode. The multiplexer 416 receives a DBIST value 412 and a TDR 414 to create a single data stream 418, labeled as tdr_override.

The override logic 420 also allows entering the DBIST mode. The multiplexer 428 receives a DBIST value 422 via a decoder 424 and a TDR 426 to create a single data stream 430, labeled as tdr_override.

JTAG protocols and the IEEE 1687 standard use serial programming, which can result in slow TDR programming. The override logic 410 and the override logic 420 aid in making the TDR programming and the DBIST test faster to provide for a faster testing mechanism using the test patterns provided by the DBIST DMA controller 122. For example, serial programming can take hundreds of cycles. By providing the override logic 410 and the override logic 420, the programming cycles can be reduced to enable faster DBIST programming capabilities.

Figure 5:
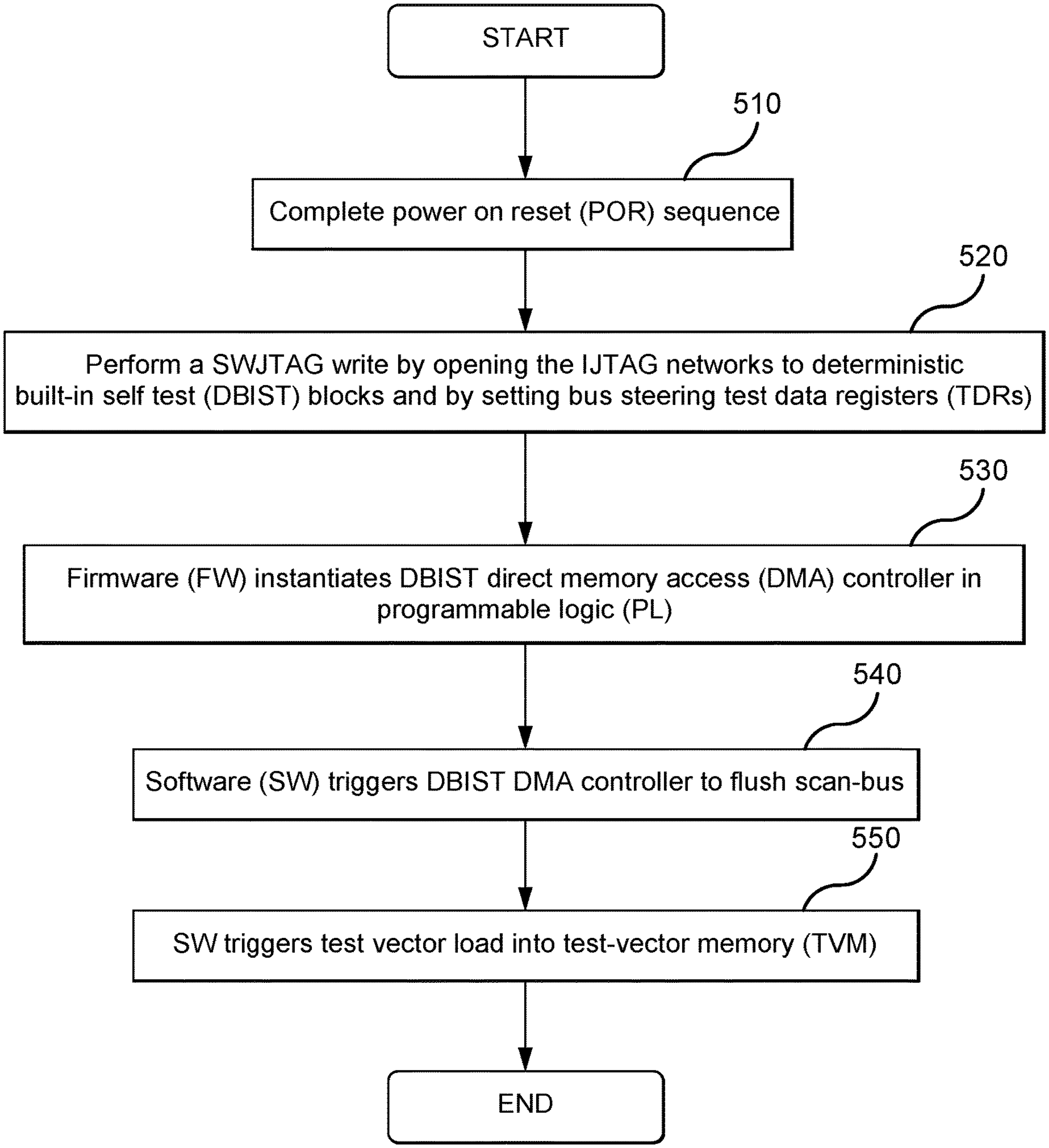
FIG. 5 illustrates a method for implementing DBIST preparation at power-up, according to an example.

FIG. 5 illustrates a method for implementing DBIST preparation at power-up, according to an example.

At block 510, a power on reset (POR) sequence is completed.

At block 520, a SW JTAG write is performed by opening the IJTAG networks to DBIST blocks and by setting bus steering test data registers.

At block 530, the FW instantiates a DBIST DMA controller 122 in the PL 120.

At block 540, the SW triggers the DBIST DMA controller 122 to flush the scan bus.

At block 550, the SW triggers the test vector load into a test-vector memory (TVM). The TVM stores the plurality of test patterns. There can be hundreds of test patterns stored in the TVM. The test patterns are created by the manufacturer of the hardware blocks 150, 160.

Figure 6:
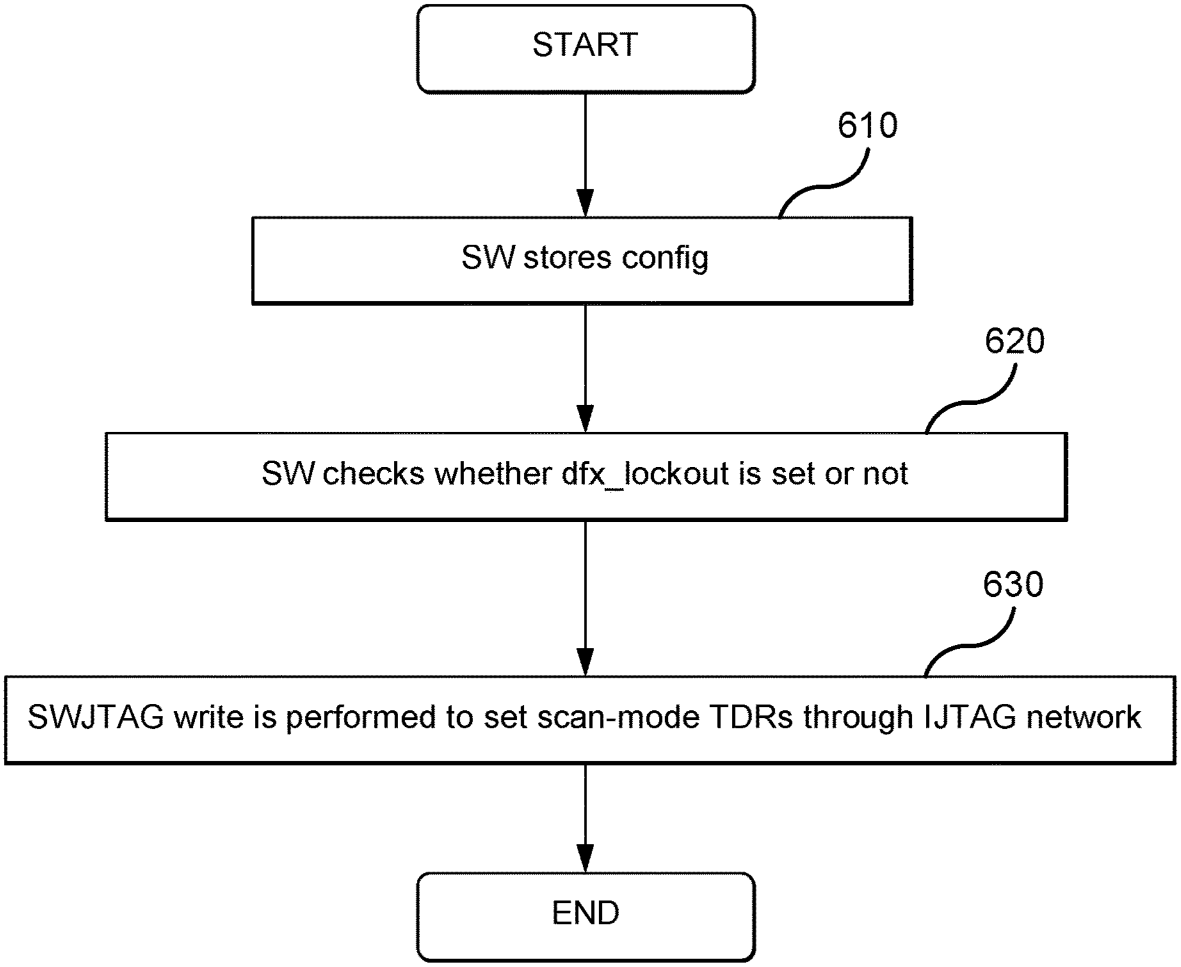
FIG. 6 illustrates a method for implementing DBIST entry, according to an example.

FIG. 6 illustrates a method for implementing DBIST entry, according to an example.

At block 610, the SW stores configuration data.

At block 620, the SW checks whether dfx_lockout is set or not. The dfx_lockout is set by the owner or operator of the hardware blocks 150, 160. The dfx_lockout prevents unauthorized access to data or information on the hardware blocks 150, 160.

At block 630, a SWJTAG write is performed to set scan-mode TDRs through IJTAG network.

Figure 7:
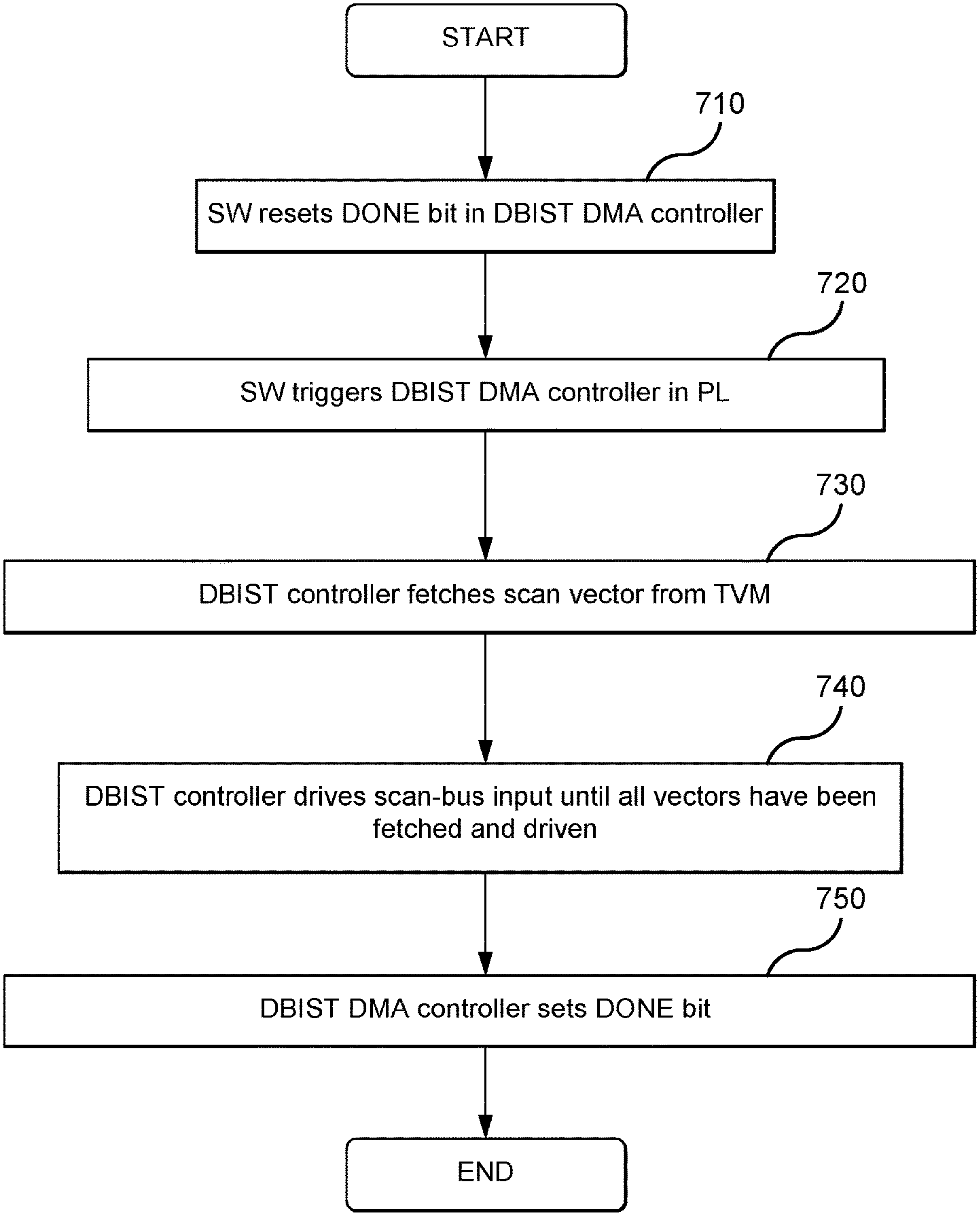
FIG. 7 illustrates a method for implementing DBIST run, according to an example.

FIG. 7 illustrates a method for implementing DBIST run, according to an example.

At block 710, the SW resets the DONE bit in the DBIST DMA controller 122.

At block 720, the SW triggers the DBIST DMA controller 122 in the PL 120.

At block 730, the DBIST DMA controller 122 fetches the scan vector from the TVM space 124.

At block 740, the DBIST DMA controller 122 drives the scan-bus input until all vectors have been fetched and driven. The vectors can refer to the test patterns stored in the TVM space 124.

At block 750, the DBIST DMA controller 122 sets the DONE bit.

Figure 8:
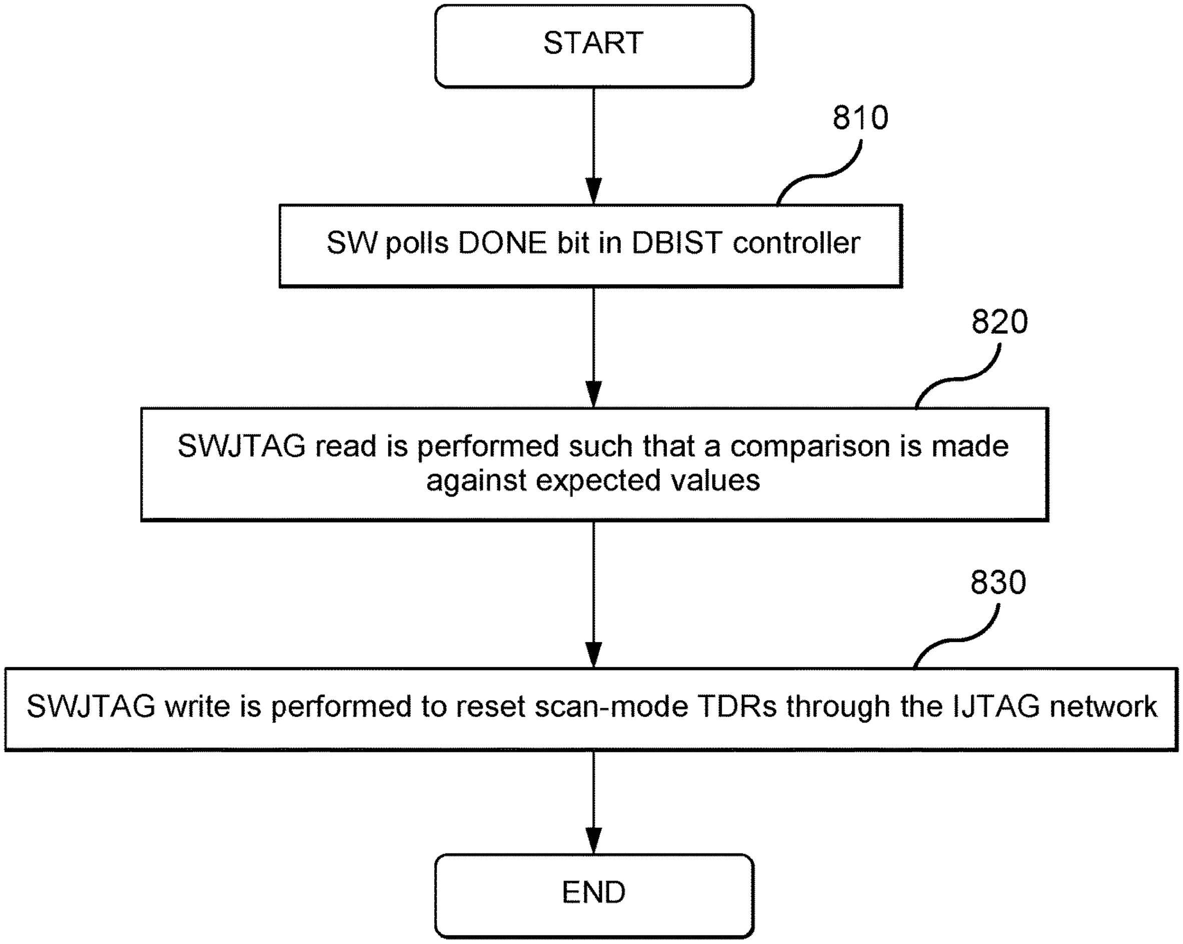
FIG. 8 illustrates a method for implementing DBIST exit, according to an example.

FIG. 8 illustrates a method for implementing DBIST exit, according to an example.

At block 810, the SW polls the DONE bit in the DBIST DMA controller 122.

At block 820, an SWJTAG read is performed such that a comparison is made against expected values. The results of the DBIST-based scan-test of a block are captured in a multiple input signature register (MISR), which is read out through the IJTAG at the end of the test. The results of the scan test are not checked per scan vector, which is the traditional way of running a scan-test. As such, the method waits until the end of the test before checking the results for an expected value. The method only checks the final signature.

At block 830, the SWJTAG write is performed to reset the scan-mode TDRs through the IJTAG network.

Figure 9:
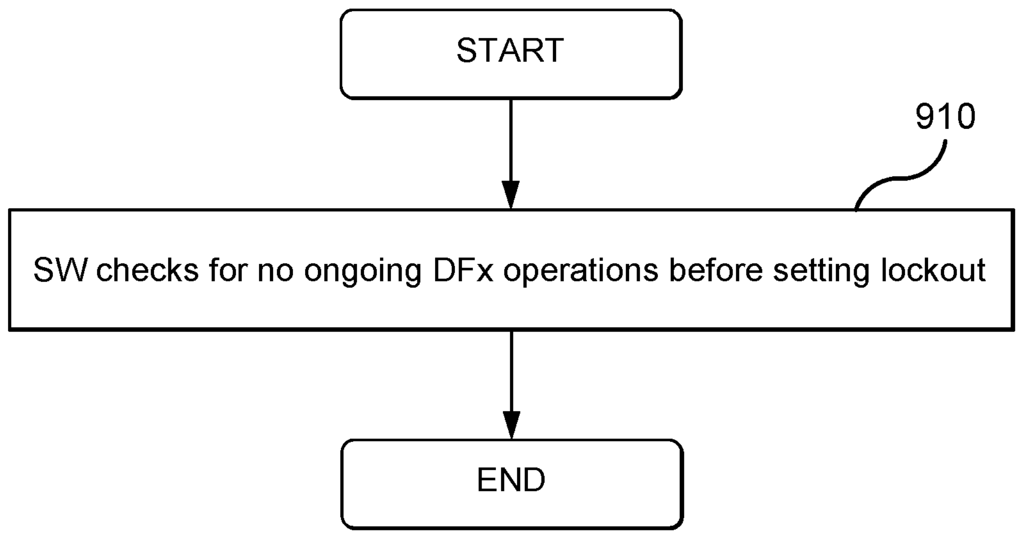
FIG. 9 illustrates a method for implementing lockout entry, according to an example.

FIG. 9 illustrates a method for implementing lockout entry, according to an example.

At block 910, for the lockout entry, the SW checks for no ongoing DFx operations before setting the lockout.

Figure 10:
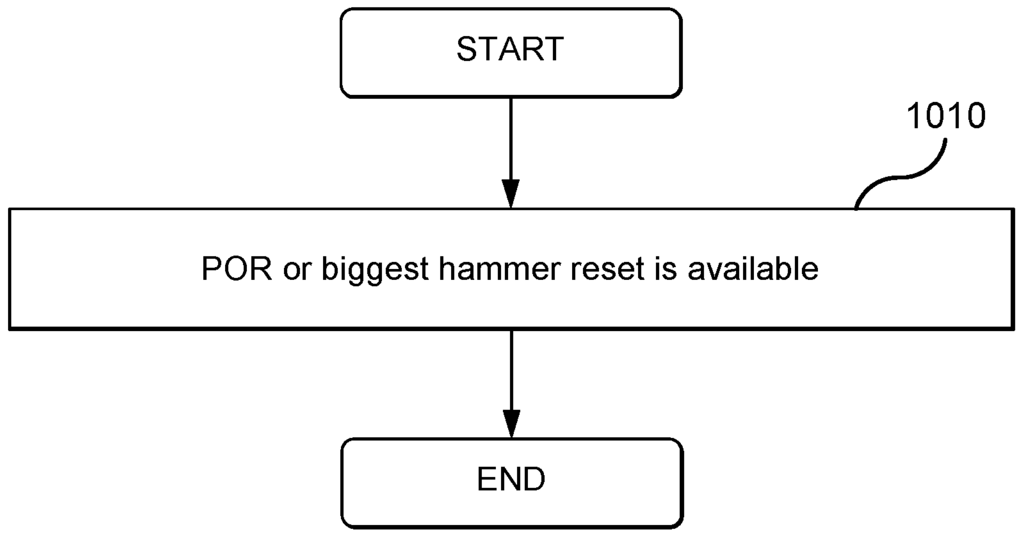
FIG. 10 illustrates a method for implementing lockout exit, according to an example.

FIG. 10 illustrates a method for implementing lockout exit, according to an example.

At block 1010, for the lockout exit, the POR or biggest hammer reset is available.

Figure 11:
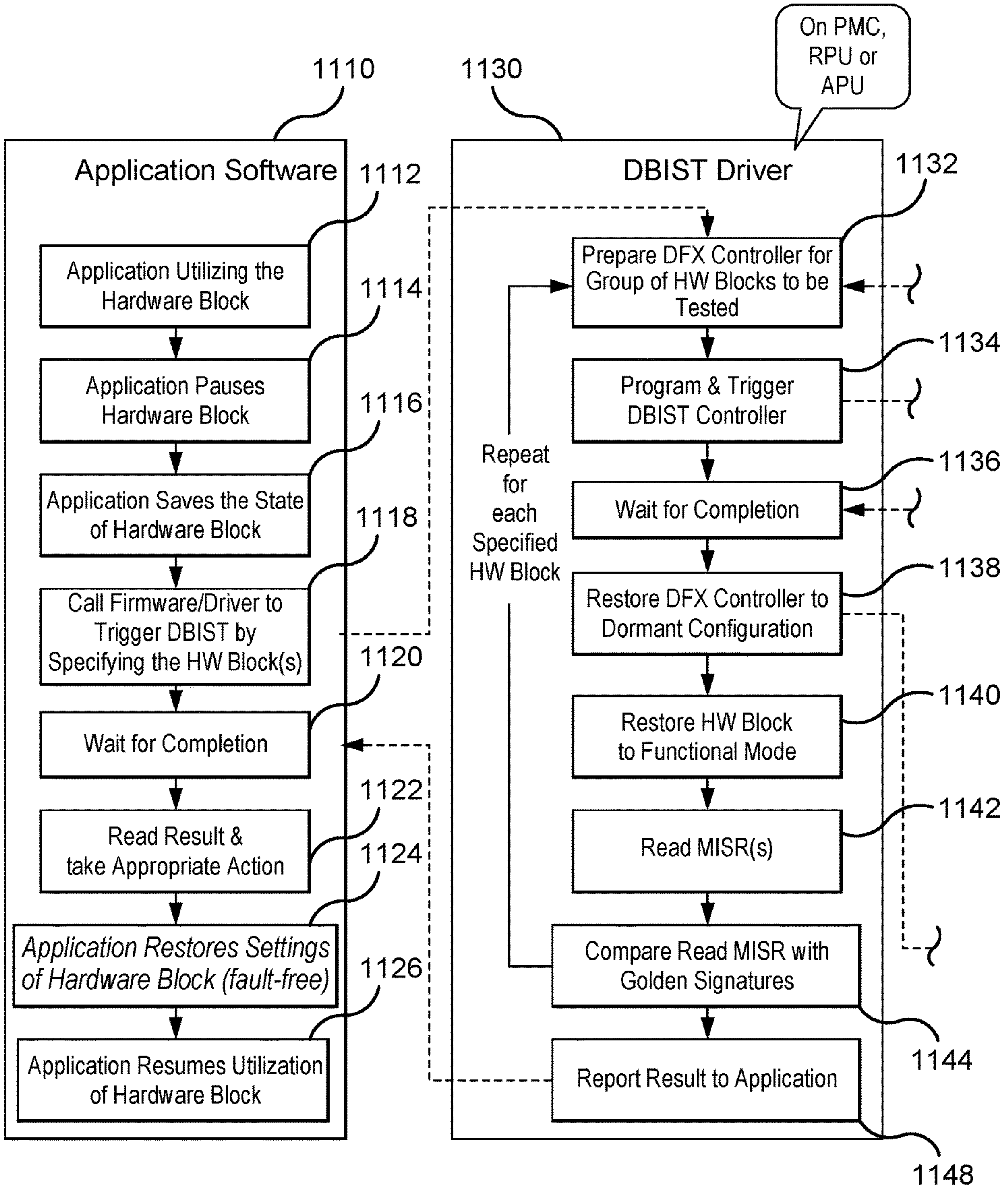
FIG. 11 illustrates a method for implementing DBIST, according to an example.
Figure 11:
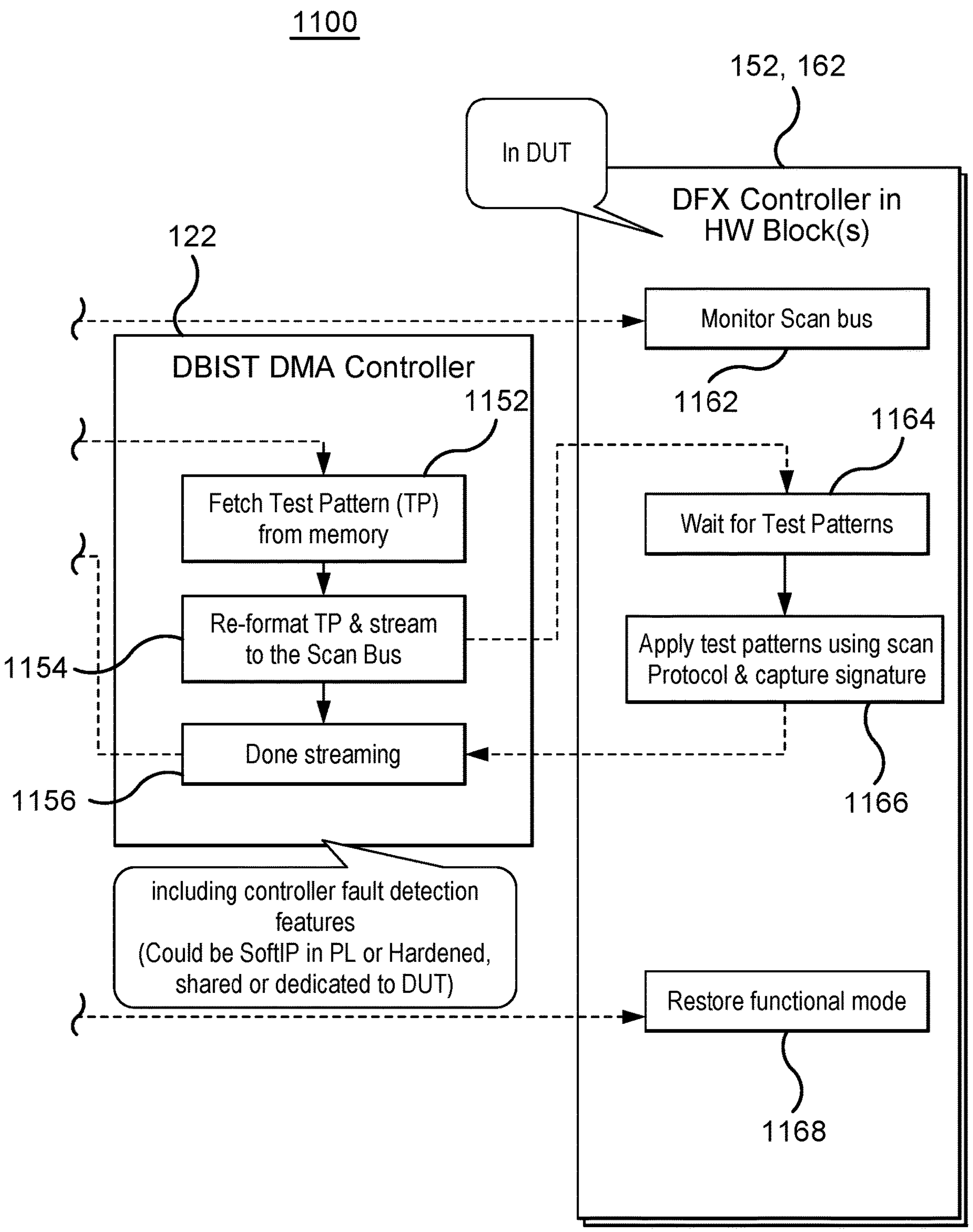

FIG. 11 illustrates a method 1100 for implementing DBIST, according to an example.

The application software 1110 communicates with the DBIST driver 1130, which, in turn, communicates with the DBIST DMA controller 122. The DBIST DMA controller 122 communicates with the DFx controller 152, 162.

The application software 1110 includes the following steps:

At block 1112, the application utilizes the hardware block. The hardware block can be a tile or target tile or tile under test. The hardware block can include a dfx_lockout.

At block 1114, the application pauses the hardware block.

At block 1116, the application saves the state of the hardware block that is required for it to restart normal operation once the DBIST is completed.

At block 1118, the firmware/driver is called to trigger the DBIST by specifying the hardware blocks. The DBIST can be performed on one or more hardware blocks.

Once block 1118 is completed, the DBIST driver 1130 is activated to perform the following steps:

At block 1132, the DFx controller 152, 162 is prepared for the group of hardware blocks or tiles or target tiles that will be tested using DBIST.

At block 1134, the DBIST DMA controller 122 is programmed and triggered. The DBIST DMA controller 122 provides the test patterns to the hardware blocks or tiles or target tiles under test.

At block 1136, the system waits for the completion of such steps.

At block 1138, the DFx controller 152, 162 is restored to a dormant configuration.

At block 1140, the hardware block is restored to a functional mode.

At block 1142, the multiple input signature registers (MISRs) are read. The MISRs test for quality assurance of the hardware blocks or tiles.

At block 1144, the read MISRs are compared with one or more golden signatures. The signature is the signature expected from the MISR of a hardware block with no faults.

At block 1148, the results are reported to block 1120, where the system was waiting for the completion of such steps.

At block 1122, the results are read and appropriate action is taken. For example if the MISR signature does not match the golden (expected) signature of a non-faulty block, then it is inferred that a fault has occurred in the block and this is reported to a central controller's error handling block.

The efficiency of testing can be achieved by the fact that DBIST re-uses existing infrastructure that is added in a design for manufacturing test. Thus, there is no extra HW cost incurred for DBIST, other than that of the DMA engine which is expected to be very small. DBIST reuses existing memory (either external or internal) for the TVM, again eliminating extra HW cost. DBIST reuses test patterns that were generated for the manufacturing test when constraints for high coverage targets in the shortest amount of time are most manifest. This ensures efficiency in coverage and test-time.

At block 1124, the application restores the settings of the hardware block if the hardware block was deemed to be fault-free.

At block 1126, the application resumes utilization of the hardware block after the DBIST test has been completed. In one example, the DBIST test has been completed when at least a portion of the test patterns have been applied to the hardware block. In another example, the DBIST test has been completed when all the test patterns have been applied to the hardware block.

The DBIST driver 1130 also communicates with the DFx controller 152, 162 to monitor the scan bus at block 1162 and to restore the functional mode at block 1168. The DBIST DMA controller 122 sends test patterns to the DFx controller 152, 162 of tiles hardware blocks 150, 160, respectively. The DBIST DMA controller 122 fetches test patterns from test vector memory space 124 at block 1152, reformats the test patterns and streams the test patterns to the scan bus at block 1154, and completes streaming at block 1156. The DFx controller 152, 162 waits for the test patterns at block 1164 and applied the test patterns using a scan protocol at block 1166. The method 1100 enables efficient in-field and in-system coverage of permanent faults in a deterministic and measurable manner.

In conclusion, device quality monitoring and assurance in the field and in-system is provided using deterministic coverage ATPG tool generated test patterns. A new IP is used by the application SW to trigger the test. The new IP can be included in the fabric as soft IP or hardened in a controller, such as the PMC. The new IP further connects to the interconnection network infrastructure in the chip for universal access to all storage resources, both internal and external. The exemplary embodiments provide for in-system and in-field coverage of technology-relevant latent and random permanent defects in a shorter time period and by reducing hardware cost. The exemplary embodiments further provide for a mechanism to generate test patterns at the manufacturing facility and send such generated test patterns with the device to the field. Thus, the test patterns generated at the manufacturing facility can be applied in the field. As such, the user has more control of the test patterns, as they are not randomly generated, and a deterministic test coverage can be achieved to have the device tested more exhaustively in the field. Therefore, an advantage of the present invention relates to enabling a more exhaustive testing of the device in the field by potentially applying hundreds of test patterns to hardware blocks, where the test patterns are generated at the manufacturing facility by the manufacturer and stored in the TVM space of the DBIST component.

DBIST finds applications in various fields where ensuring the reliability and fault-free operation of digital circuits is crucial. Some common applications for DBIST include aerospace systems, automotive electronics, telecommunication equipment, industrial control systems, as well as consumer electronics. Aerospace applications demand high reliability and fault tolerance. DBIST is used to thoroughly test digital circuits in avionics systems, satellite communication systems, and other aerospace electronics. In automotive systems, safety and reliability are paramount. DBIST is employed to test digital components in vehicles, including engine control units (ECUs), airbag systems, and other critical electronics. Telecommunication infrastructure relies on complex digital circuits. DBIST is used to verify the integrity of components in routers, switches, base stations, and other telecommunication equipment. DBIST is employed in industrial control systems to test digital controllers, programmable logic controllers (PLCs), and other components that play a role in manufacturing processes and automation. While consumer electronics may use a combination of testing methods, DBIST can still find application in high-end or safety-critical devices. This includes applications in smart appliances, high-end audio equipment, and other consumer electronics where reliability is a priority. DBIST is applied to test digital circuits in networking equipment such as routers, switches, and network interface cards to ensure their proper functioning and reliability. The exemplary embodiments can be applied to any of these practical applications.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a “circuit,” “module” or “system.” Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the “C” programming language or similar programming languages. The program code may execute entirely on the user’s computer, partly on the user’s computer, as a stand-alone software package, partly on the user’s computer and partly on a remote computer or entirely on the remote computer or server. In the latter scenario, the remote computer may be connected to the user’s computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A computer architecture comprising:

a device having:

a test vector memory (TVM) space configured to store deterministic test patterns generated during manufacturing of the device and stored for use during in-field testing, wherein the deterministic test patterns comprise manufacturing-generated automatic test pattern generation (ATPG) scan vectors stored in the TVM space prior to deployment of the device for replay during in-field testing; and a deterministic built-in self-test (DBIST) direct memory access (DMA) controller configured to retrieve the deterministic test patterns directly from the TVM space via an interconnection network and apply the deterministic test patterns, using a scan bus, to at least one selected hardware block under test during the in-field testing, wherein the DBIST DMA controller streams the manufacturing-generated ATPG scan vectors from the TVM space directly to scan chains of the at least one selected hardware block under test during runtime operation of the device without placing the device into a system reset mode, while one or more other hardware blocks of the device remain in a functional mode.

2. The computer architecture of claim 1, wherein the DBIST DMA controller sends a scan bus signal from the scan bus and a scan clock signal to the at least one selected hardware block under test.

3. The computer architecture of claim 2, wherein the scan bus signal provides the deterministic test patterns to the at least one selected hardware block under test.

4. The computer architecture of claim 1, wherein the device is part of a field-programmable gate array (FPGA).

5. The computer architecture of claim 1, wherein the deterministic test patterns are generated at a manufacturing facility and stored in an uncompressed format.

6. The computer architecture of claim 1, wherein a DFx lockout circuit is configured to prevent access to the at least one selected hardware block under test on a programmable security setting.

7. The computer architecture of claim 1, further comprising a multiple input signature register (MISR) configured to receive outputs from the at least one selected hardware block under test during DBIST testing and provide a compacted signature for comparison to an expected signature.

8. The computer architecture of claim 1, wherein the DBIST DMA controller applies test patterns to the at least one selected hardware block under test while maintaining clock signals to downstream hardware blocks in a glitch-free manner.

9. The computer architecture of claim 1, wherein the manufacturing-generated ATPG scan vectors are generated prior to deployment of the device and reused during in-field testing without regeneration of the manufacturing-generated ATPG scan vectors on the device.

10. The computer architecture of claim 1, wherein the at least one selected hardware block under test is coupled to a plurality of other hardware blocks, and wherein the plurality of other hardware blocks remain functional during DBIST testing of the at least one selected hardware block.

11. The computer architecture of claim 10, wherein a system or device controller using firmware allows the plurality of other hardware blocks to remain functional during the DBIST testing of the at least one selected hardware block.

12. The computer architecture of claim 10, wherein output clamping logic allows the plurality of other hardware blocks to remain functional during the DBIST testing of the at least one selected hardware block.

13. A method comprising:

using a device to:

store deterministic test patterns generated during manufacturing of the device in a test vector memory (TVM) space for reuse during in-field testing, wherein the deterministic test patterns comprise manufacturing-generated automatic test pattern generation (ATPG) scan vectors stored in the TVM space prior to deployment of the device for replay during in-field testing; and allow a deterministic built-in self-test (DBIST) direct memory access (DMA) controller to retrieve the deterministic test patterns directly from the TVM space via an interconnection network and apply the deterministic test patterns, using a scan bus, to at least one selected hardware block under test during in-field testing, wherein the DBIST DMA controller streams the manufacturing-generated ATPG scan vectors from the TVM space directly to scan chains of the at least one selected hardware block under test during runtime operation of the device without placing the device into a system reset mode, while one or more other hardware blocks of the device remain in a functional mode.

14. The method of claim 13, wherein the DBIST DMA controller sends a scan bus signal from the scan bus and a scan clock signal to the at least one selected hardware block under test, the scan bus signal providing the test patterns to the at least one selected hardware block under test.

15. The method of claim 13, wherein the device communicates with a system controller communicating with the at least one selected hardware block under test via a programming side channel.

16. The method of claim 13, further comprising a multiple input signature register (MISR) configured to receive outputs from the at least one selected hardware block under test during DBIST testing and provide a compacted signature for comparison to an expected signature.

17. The method of claim 13, wherein the manufacturing-generated ATPG scan vectors are generated prior to deployment of the device and reused during in-field testing without regeneration of the manufacturing-generated ATPG scan vectors on the device.

18. The method of claim 13, wherein the at least one selected hardware block under test is coupled to a plurality of other hardware blocks, and wherein the plurality of other hardware blocks remain functional during DBIST testing of the at least one selected hardware block.

19. The method of claim 18, wherein a system or device controller using firmware allows the plurality of other hardware blocks to remain functional during the DBIST testing of the at least one selected hardware block.

20. The method of claim 18, wherein output clamping logic allows the plurality of other hardware blocks to remain functional during the DBIST testing of the at least one selected hardware block.

* * * * *